(12) United States Patent
Deng et al.

(10) Patent No.: US 8,881,083 B1
(45) Date of Patent: Nov. 4, 2014

(54) METHODS FOR IMPROVING DOUBLE PATTERNING ROUTE EFFICIENCY

(71) Applicant: GLOBALFOUNDRIES Inc., Grand Cayman (KY)

(72) Inventors: Yunfei Deng, Sunnyvale, CA (US); Lei Yuan, Cupertino, CA (US); Hidekazu Yoshida, San Jose, CA (US); Juhan Kim, Santa Clara, CA (US); Mahbub Rashed, Cupertino, CA (US); Jongwook Kye, Pleasanton, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 24 days.

(21) Appl. No.: 13/874,803

(22) Filed: May 1, 2013

(51) Int. Cl.
*G06F 17/50* (2006.01)
*H01L 23/48* (2006.01)

(52) U.S. Cl.
CPC .......... *G06F 17/5077* (2013.01); *H01L 23/481* (2013.01)
USPC .......................................... 716/119; 716/130

(58) Field of Classification Search
CPC ............ G06F 17/5068; G06F 17/5072; G06F 17/5077
USPC ..................................... 716/119, 130
See application file for complete search history.

(56) References Cited

U.S. PATENT DOCUMENTS

| | | | | |
|---|---|---|---|---|
| 6,014,507 | A * | 1/2000 | Fujii | 716/129 |
| 7,269,056 | B1 * | 9/2007 | Liaw | 365/154 |
| 2006/0168551 | A1 * | 7/2006 | Mukuno | 716/5 |
| 2012/0131528 | A1 * | 5/2012 | Chen et al. | 716/112 |
| 2012/0331430 | A1 * | 12/2012 | Chun et al. | 716/54 |

* cited by examiner

*Primary Examiner* — Suresh Memula
(74) *Attorney, Agent, or Firm* — Darrell L. Pogue; Keohane & D'Alessandro PLLC

(57) ABSTRACT

A design methodology for routing for an integrated circuit is disclosed. The method includes placement of cells having double diffusion breaks, which create an extended intercell region. Metal layer prohibit zones are defined to prohibit any M1 structures in the prohibit zones. Metal layer allow zones are placed adjacent to outer metal lines, and jogs are formed in the metal layer allow zones. Vias and viabars may then be applied on the jogs.

20 Claims, 6 Drawing Sheets

METHODS FOR IMPROVING DOUBLE PATTERNING ROUTE EFFICIENCY

FIELD OF THE INVENTION

The present invention relates generally to integrated circuit design and, more particularly to improvements in routing for integrated circuit design.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

A layout file is then created using the netlist. This is accomplished through a placing and routing process, which assigns logic cells to physical locations in the device layout and routes their interconnections. The physical layout is typically described as many patterned layers, and the pattern of each layer is described by the union of a set of polygons. The layout data set is stored, for example, in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process. One or more photomasks are created from the layout file for the photolithography of each layer. Photomasks are used to transfer the layout pattern onto the physical layer on the wafer. A photomask, or mask, provides an image of the desired physical geometries of the respective integrated circuit layer. Passing light through the mask projects the layout pattern for the layer onto the wafer. An imaging lens system projects and focuses the layout onto the substrate. The projected light pattern interacts with a photosensitive resist coating on the wafer, and resist portions that are exposed to light are rendered either soluble or insoluble in a developer solution, depending on the type of the photoresist. Accordingly, the mask pattern is transferred into the photo-resist by optical projection and chemical reactions. The photo-resist pattern is subsequently transferred to an underlying layer by an etch process. Most commonly, plasma containing chemically-selective reactive ions is used to etch high-aspect ratio trenches and holes with nearly vertical sidewalls.

With a continuing desire to provide greater functionality in smaller packages and the evolution of system-on-chip and mixed-signal designs, IC feature geometries are being driven to smaller and smaller dimensions. However, the ability to project an accurate image of increasingly smaller features onto the wafer is limited by the wavelength of the light used and the ability of the lens system. Double patterning technology (DPT) may be used to print patterns with a pitch that is tighter than can be printed with a single exposure. In DPT technology, approximately one-half the geometries of the interconnect pattern are placed on a first double patterning photomask, and the remainder of the geometries are placed on a second double patterning photomask. For example, a pattern with a 100 nanometer pitch which prints blurred when all geometries are placed on a single photo mask may be decomposed into two DPT photomasks, each with a 200 nanometer pitch which print without blurring. Geometries placed on the first DPT photomask are described as having a first color, and geometries placed on the second DPT photomask are described as having a second color.

With DPT, the design rules for the same color may differ from the design rules for dissimilar colors. Typically, the spacing requirements for lines of the same color are larger than that for lines of dissimilar colors. Unrestricted routing layout may result in "color conflicts" which violate DPT design rules. Resolving these conflicts to render a pattern DPT compatible may be computationally intensive and may also require significant re-layout of the pattern, which can significantly increase cost.

As more complicated designs are developed to achieve higher performance and higher reliability in a smaller chip area, the demands placed on routing tools increase. It is therefore desirable to have improvements in routing for integrated circuit design.

SUMMARY OF THE INVENTION

A first aspect of the present invention provides a method for designing an integrated circuit, comprising: arranging a plurality of cells, wherein each cell includes a plurality of metal lines which comprise inner metal lines and outer metal lines, and an intercell region disposed between each cell of the plurality of cells; identifying a metal layer prohibit zone for each of the plurality of cells; identifying a metal layer allow zone adjacent to the outer metal lines for each of the plurality of cells; identifying metal layer lines that are candidates to have a jog applied to them; applying a jog to the identified metal layer lines; and applying a via on the jog.

A second aspect of the present invention provides a system for designing an integrated circuit, comprising one or more processors coupled to non-transitory memory containing machine instructions, that when executed by the one or more processors, perform the functions of: arranging a plurality of cells including a plurality of metal lines which comprise inner metal lines and outer metal lines, and an intercell region disposed between each cell of the plurality of cells; establishing a metal layer prohibit zone for each of the plurality of cells; establishing a metal layer allow zone adjacent to the outer metal lines for each of the plurality of cells; identifying metal layer lines that are candidates to have a jog applied to them; and applying a jog to the identified metal layer lines.

A third aspect of the present invention provides an integrated circuit comprising: a plurality of cells, wherein each cell includes a plurality of metal lines which comprise inner metal lines and outer metal lines, and an intercell region disposed between each cell of the plurality of cells; and a metal layer line within at least one of the plurality of cells, disposed adjacent to an intercell region, wherein the metal layer line comprises a jog.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Exemplary embodiments will now be described more fully herein with reference to the accompanying drawings, in which exemplary embodiments are shown. Embodiments of the present invention provide a design methodology that improves routing for an integrated circuit. The placed cells include double diffusion breaks. A double diffusion break (DDB) refers to a standard cell architecture where the cell boundary is tucked under a dummy polysilicon gate line. Use of cells with a double diffusion break can provide more uniform transistor performance and better design performance. Metal layer 1 (M1) prohibit zones are defined to prohibit any M1 structures in the prohibit zones. This facilitates adding additional vias and/or viabars to improve circuit performance and product yield.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1:
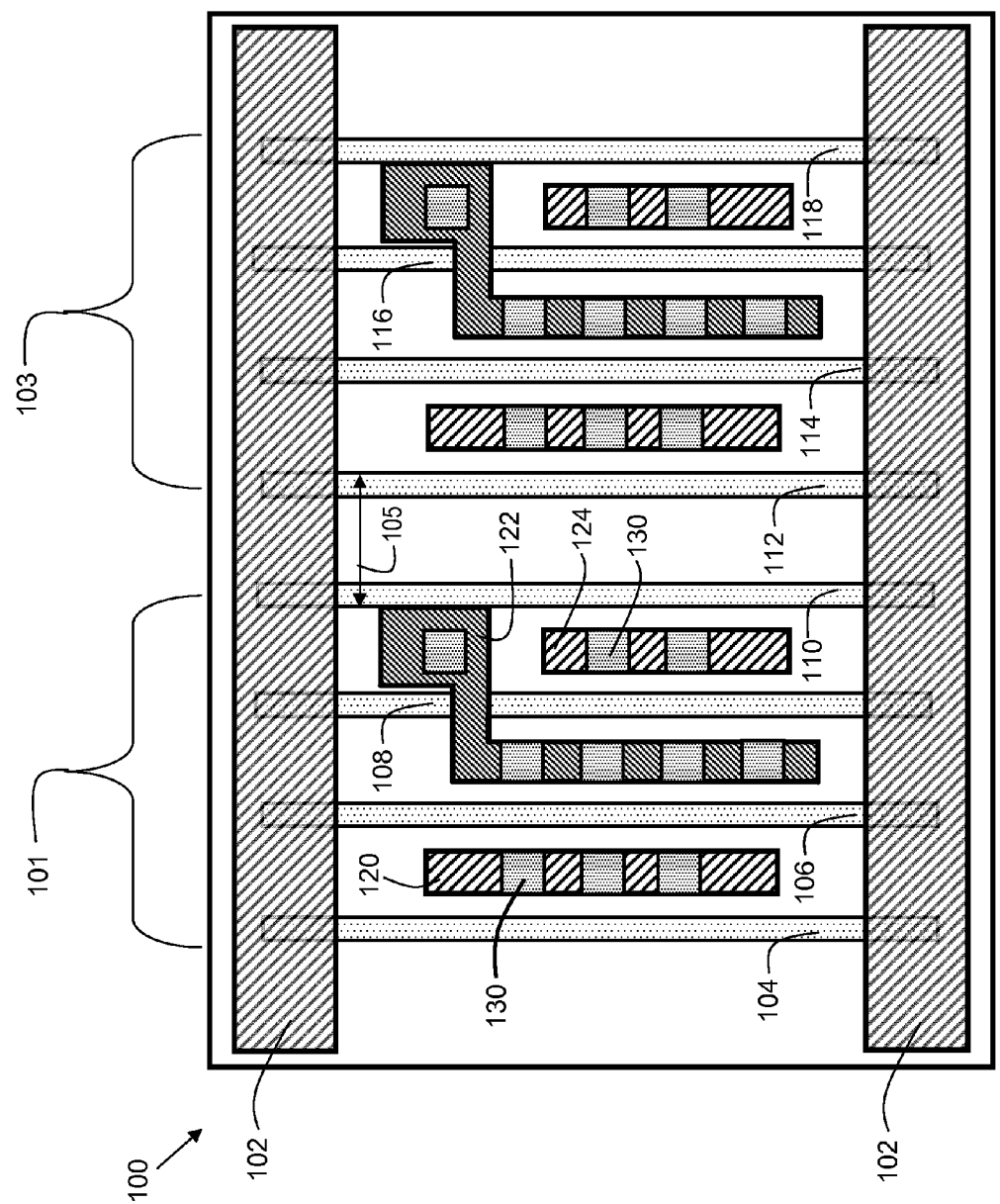
FIG. 1 shows the placement of two cells with a double diffusion break in accordance with illustrative embodiments.

FIG. 1 shows an integrated circuit 100 with two cells 101 and 103 with an intercell region 105 disposed between them. Each cell may be a standard cell. In some embodiments, the cells may be one of NOT, NAND, NOR, XOR, AND, OR, and buffer gate. The cells are connected together via one or more metallization layers to form more complex circuits. Power rails 102 provide power to the cells 101 and 103. Power rails 102 are formed in the first metallization layer (M1). Cell 101 has metal layer lines 120 and 124 that are M1 lines that are formed by mask 1 (color 1), and metal layer line 122 that are M1 lines that are formed by mask 2 (color 2). Metal layer lines 120 and 124 are outer lines, as they are the outermost lines within cell 101. Line 122 is an inner line. A via layer connects the metal lines of a particular layer with another layer. Possible via insertion points are shown by reference 130, which may also be referred to as via "ports" within this disclosure. In embodiments, the metal layer lines 120, 122, and 124 may be made of copper.

The cells 101 and 103 are each comprised of a plurality of transistors, which comprise gates. Cell 101 includes gates 104, 106, 108, and 110. The gates may be comprised of polysilicon. Cell 101 includes double diffusion breaks (DDBs), and, hence, gates 104 and 110 are dummy gates (non-functional). Similarly, cell 103 includes double diffusion breaks (DDBs), and includes gates 112, 114, 116, and 118, where gates 112 and 118 are dummy gates (non-functional). Intercell region 105 is the region between cells 101 and 103, starting from gate 110 of cell 101 and extending to gate 112 of cell 103, as indicated by arrow with reference number 105.

Due to various design rules, there are constraints on where vias 130 can be placed on a line. For example, enclosure rules may dictate that a certain amount of extra space or margin be present around a via, such that a via cannot be placed at the very end of a line. Usually, the space required by enclosure rules for the end of a line is larger than that for the side of a line. As the device critical dimensions shrink, the number of vias that can be placed on a line may be reduced. For example, metal layer line 120 has three via ports 130 on it, while metal layer line 124 has only two via ports on it, because it is shorter and, due to design rules, there is insufficient room for a third via. However, it may be desirable to have a third via as part of the circuit design.

Figure 2:
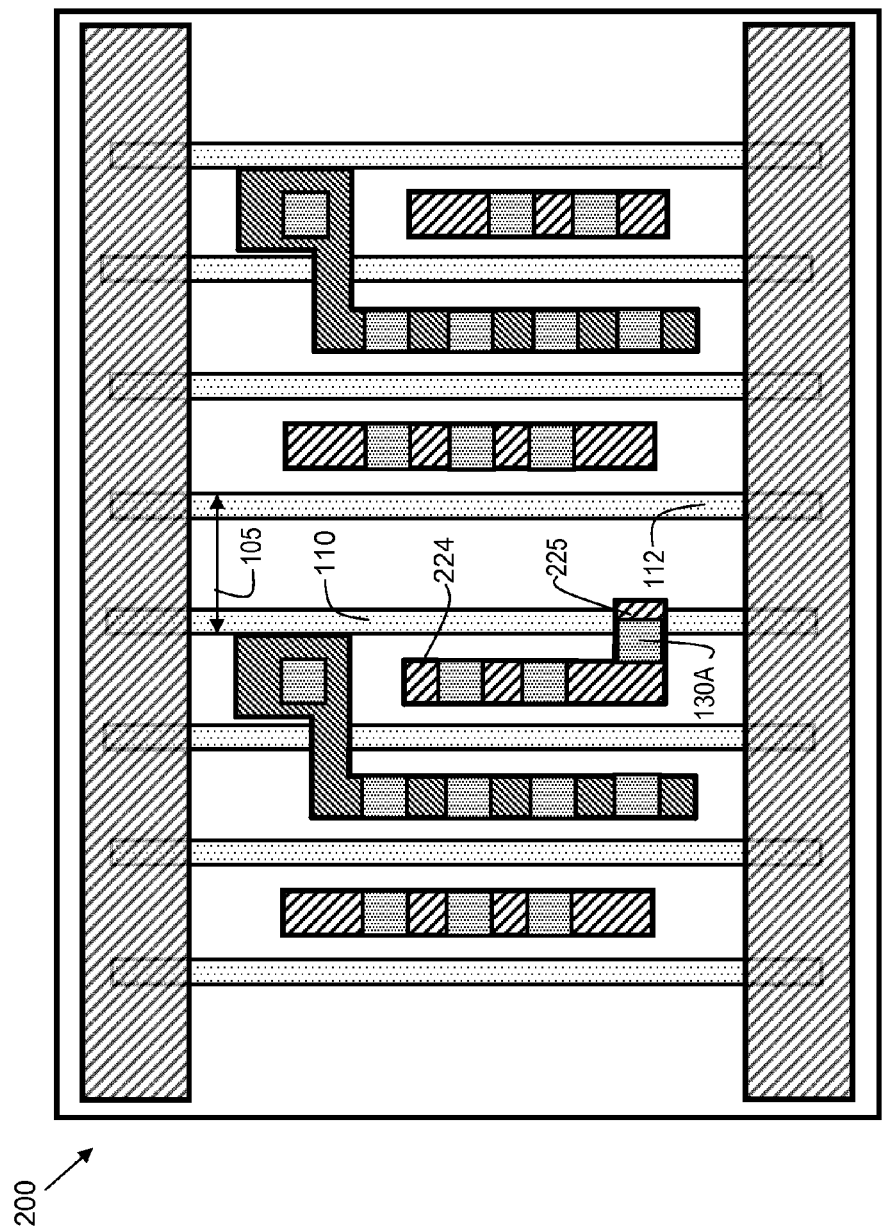
FIG. 2 shows a cell with an L-shaped line in accordance with illustrative embodiments.

FIG. 2 shows an integrated circuit 200 with a cell having a metal layer line 224 having an L-shape, with a line jog in accordance with illustrative embodiments. Embodiments of the present invention exploit the area in the intercell region 105 and allow the routing processes to make jogs when the metal layer line is adjacent to the intercell region 105. The metal layer line may be an M1 line. Since metal layer line 224 is adjacent to the intercell region 105, it is possible to form a jog 225 which extends into the intercell region. The jog 225 converts the bottom line end of line 224 to a horizontally oriented line so that no vertical via enclosure rule is required. Instead, a horizontal via enclosure rule is used. An additional via 130A is then applied to the jog 225. Hence, the line 224 (including jog 225) includes three via ports, whereas line 124 (FIG. 1) only has the capacity for two via ports. Therefore, as scaling reduces the length of lines, embodiments of the present invention enable the number of vias to remain the same and still honor the design rules.

Figure 3:
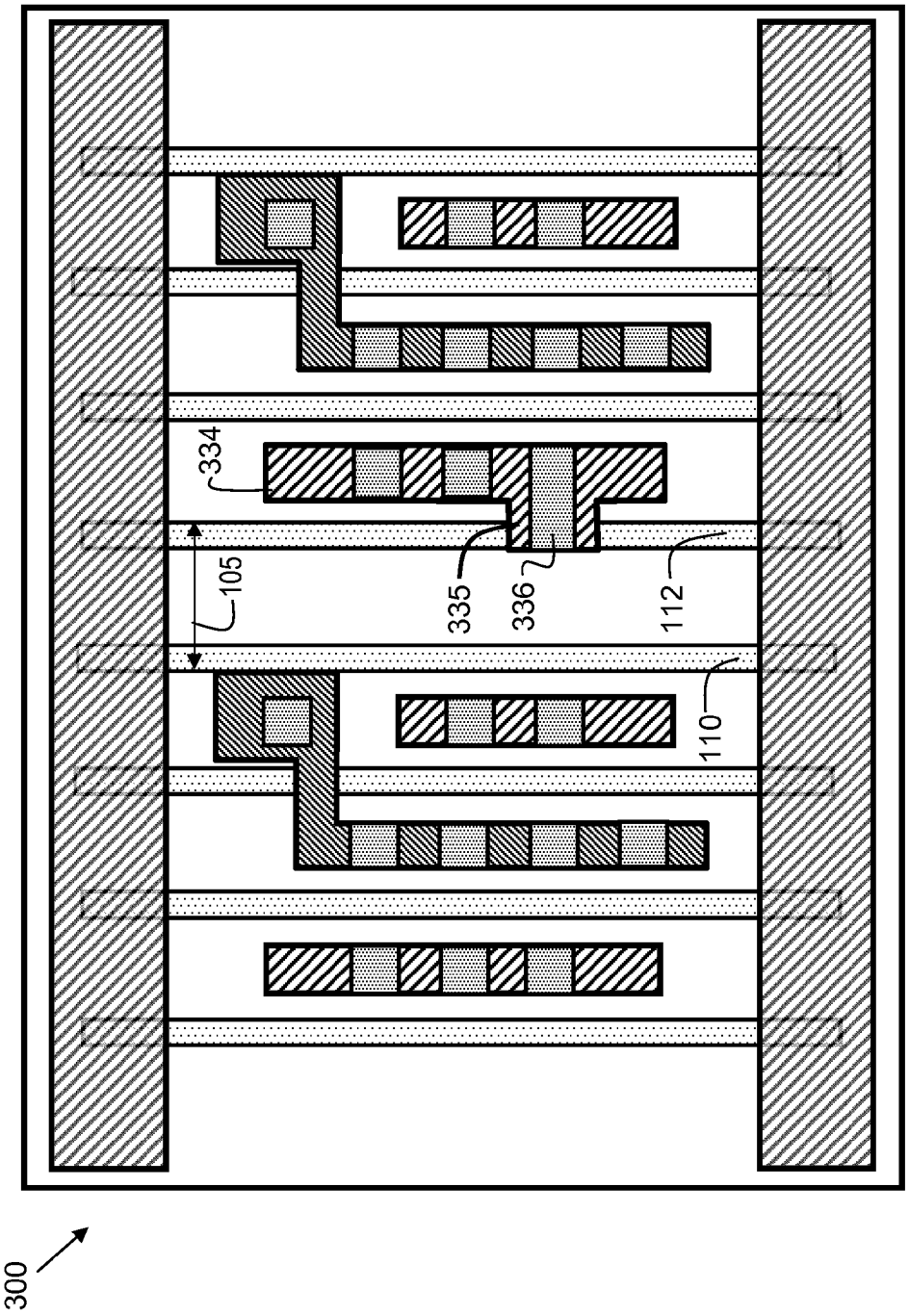
FIG. 3 shows a cell with a viabar in the double diffusion break area in accordance with illustrative embodiments.

FIG. 3 shows an integrated circuit 300 with a viabar 336 in the intercell region 105 in accordance with illustrative embodiments. The term "viabar" is used herein to mean a via having a rectangular shaped cross section with one set of sides of the rectangle at least twice as long as the other set of sides, as shown with viabar 336 in FIG. 3. Viabar 336 contacts jog 335 which is part of metal line 334. A viabar may be desirable in certain integrated circuit designs because it provides a connection with reduced resistance. Furthermore, a viabar is easier to manufacture than a square via, and, hence, yield may also be improved when a viabar is used in place of a square via. Embodiments of the present invention enable the use of viabars and, hence, can improve product yield and product performance.

Figure 4:
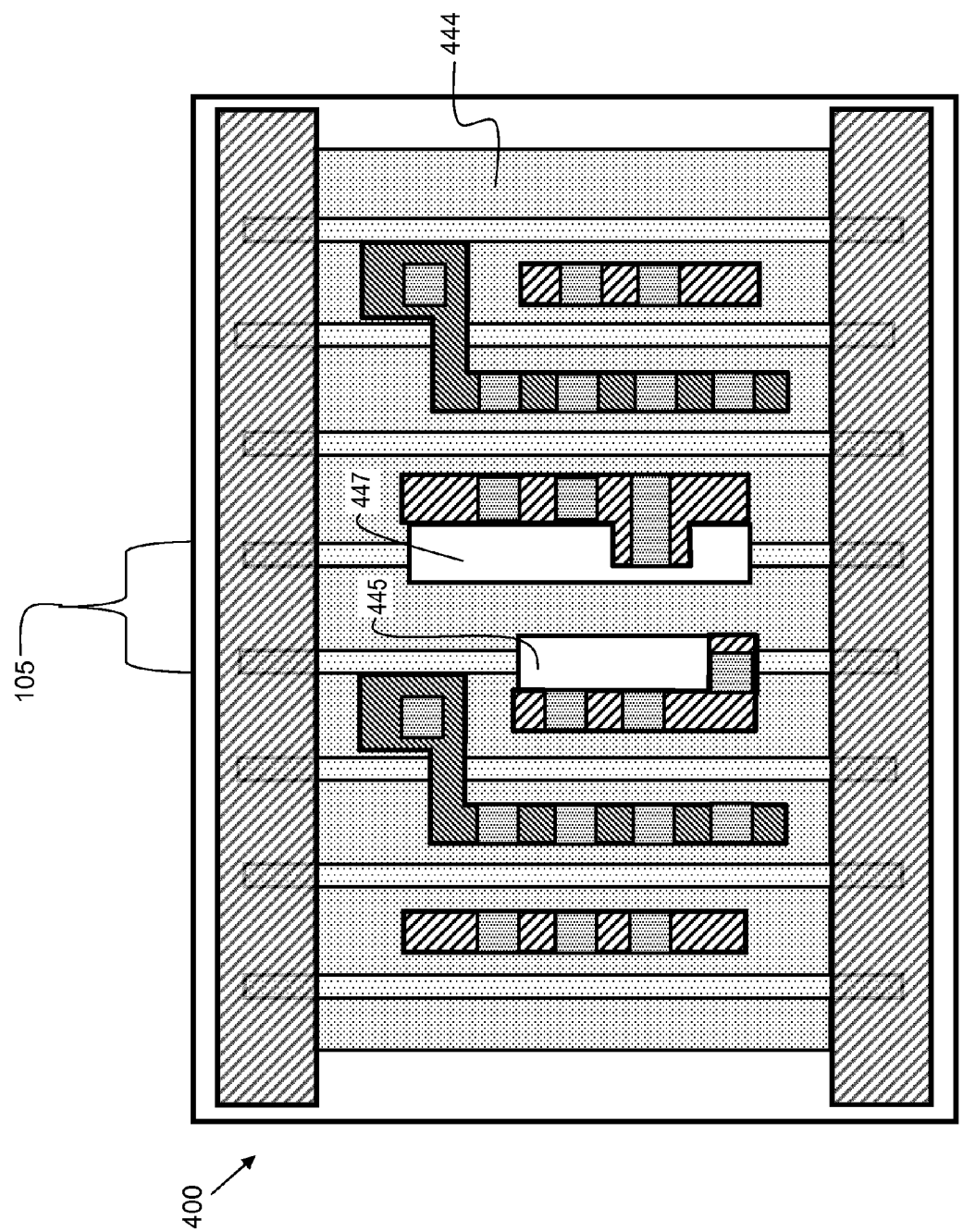
FIG. 4 shows the placement of two cells with defined metal prohibit regions in accordance with illustrative embodiments.

FIG. 4 shows an integrated circuit 400 with two cells with a defined metal 1 prohibit region in accordance with illustrative embodiments. The metal 1 prohibit region 444 is a logical region established for an electronic design automation (EDA) tool such as a router, to prevent the router from generating metal 1 structure in the metal prohibit regions. Metal prohibit region 444 includes most of cell 101 and cell 103 that are not occupied by metal 1 pins, and also includes most of the intercell region 105. Therefore, the router will not route metal 1 (M1) lines all the way across the intercell region 105. However, metal 1 structures are allowed to enter regions 445 and 447, which are metal 1 allow zones, and extend into the periphery of the intercell region when more room is needed for a line jog. The metal allow zones 445 and 447 may be defined adjacent to the outer metal lines of a cell (e.g., line 124 of FIG. 1 and line 334 of FIG. 3). Hence, the metal allow zones, in accordance with embodiments of the present invention, define the regions where a router can create M1 shapes for an L-pin (e.g. 224 of FIG. 2), or a viabar (e.g. 335 of FIG. 3) without risk of causing a color conflict.

Figure 5:
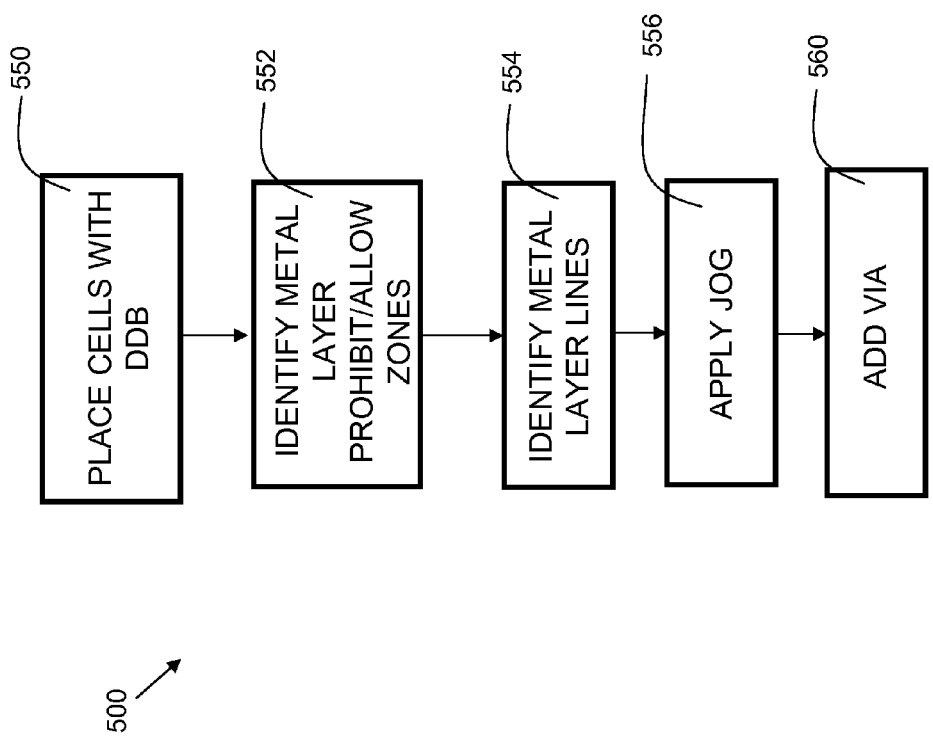
FIG. 5 is a flowchart indicating process steps for illustrative embodiments.

FIG. 5 is a flowchart 500 indicating process steps for illustrative embodiments. In process step 550, a plurality of cells are placed which include double diffusion breaks. In process step 552, metal layer prohibit zones and metal layer allow zones are identified (e.g. for M1). In process step 554, metal lines are identified that would benefit from a jog and are adjacent to an intercell region. The metal lines may be M1 metal lines. Criteria to determine if a metal line would benefit from a jog may include, but are not limited to, consideration of the length of the line (lines shorter than a predetermined distance may be candidates to apply a line jog), consideration of the number of via ports currently on the metal line prior to adding a jog (in general, lines with less than three via ports may be candidates to apply a line jog), the location of the line relative to an intercell region (lines adjacent to an intercell region may be candidates to apply a line jog), and design considerations that may make a viabar advantageous. Once such metal lines are identified, the process continues to process step 556, where a jog is applied. The jog may be applied at an end of the metal line, which results in an L-shaped line (such as line 224 of FIG. 2), or the jog may be applied at an intermediate point within the line (such as jog 335 in FIG. 3). In process step 560, a via may then be applied to the line at the location of the jog. The via may be an additional square via, such as via 130A in FIG. 2, or a viabar such as 336 of FIG. 3.

Figure 6:
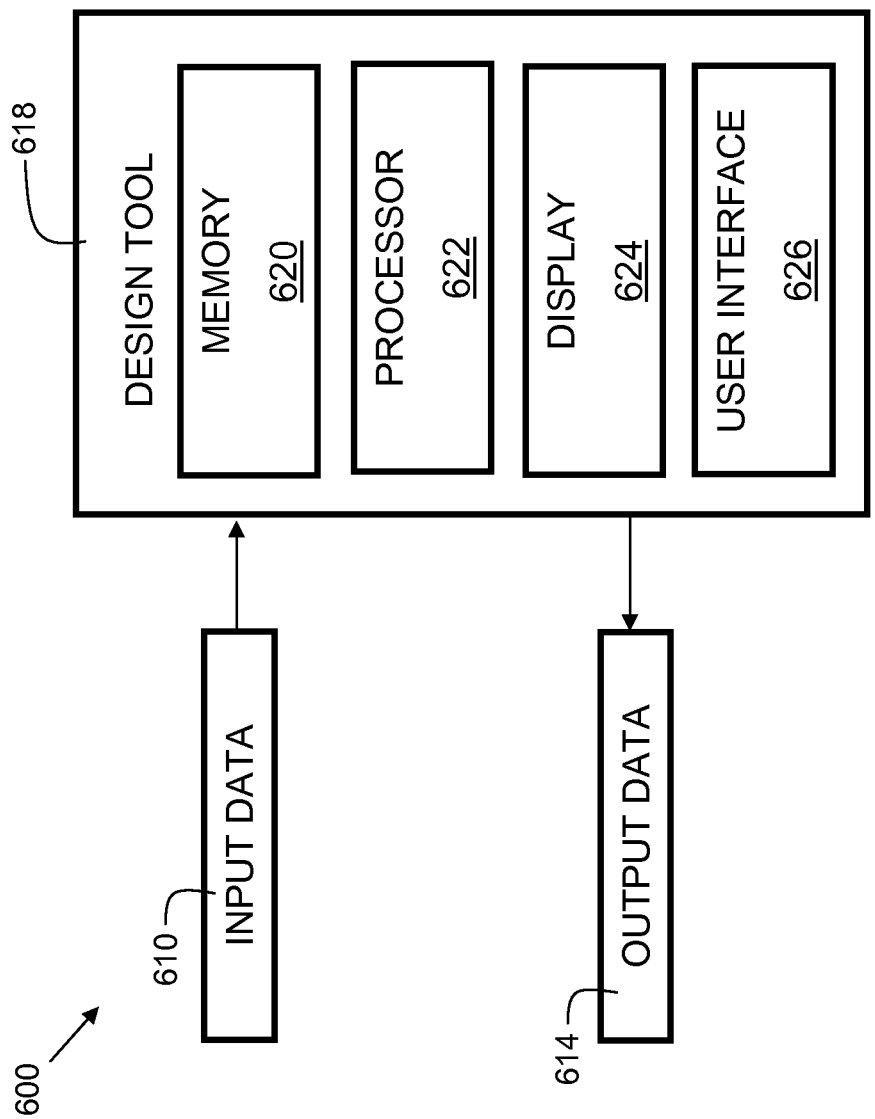
FIG. 6 is a system diagram for implementing illustrative embodiments.

FIG. 6 is a system diagram for implementing illustrative embodiments. System 600 includes a design tool 618. Design tool 618 may be a computer comprising memory 620, and a processor 622 which is coupled to memory 620, such that the processor 622 may be configured to read and write memory 620. In some embodiments, multiple processors or cores may be used. The memory 620 may be a non-transitory computer-readable medium, such as flash, ROM, non-volatile static ram, or other non-transitory memory. The memory 620 contains instructions that, when executed by processor 622, control the various subsystems to operate system 600. Design tool 618 may also include a display 624 and a user interface 626 for interacting with the system 600. The user interface 626 may include a keyboard, touch screen, mouse, or the like.

The design tool 618 may receive input data 610. Input data 610 may include a design structure, which may include a plurality of cells placed with double diffusion breaks. Metal prohibit zones and metal allow zones may be defined such that an EDA tool such as a router may place metal lines that extend into the intercell region to enable placing an extra via and/or a viabar on the metal line. The design structure may be a logical simulation design structure generated and processed by a design process to produce a logically equivalent functional representation of a hardware device. The design structure may also, or alternatively, include data and/or program instructions that when processed by design tool 618, generate a functional representation of the physical structure of a hardware device. The input data 610 may include hardware-description language (HDL) design entities or other data structures conforming to and/or compatible with lower-level HDL design languages such as Verilog and VHDL, and/or higher level design languages such as C, C++, or Python. Embodiments of the present invention may further include a computer program product embodied in a non-transitory computer-readable medium.

The design tool 618 may generate output data 614. The generated output data 614 may be in a stream format indicative of a design structure including a plurality of cells placed with double diffusion breaks. The metal lines may include jogs that extend into the intercell region to enable placing an extra via and/or a viabar on the metal line. The output data may reside in a storage medium in a data format used for the exchange of layout data of integrated circuits (e.g. information stored in a GDSII (GDS2), GL1, OASIS, or any other suitable format for storing such design structures). Output data 614 may include information such as, for example, parameterized cells, test data files, design content files, manufacturing data, layout parameters, wires, middle of line (MOL) interconnect information, net lists, levels of metal, vias, shapes, data for routing through the manufacturing line, and any other data required by a semiconductor manufacturer to produce embodiments of the present invention.

As can now be appreciated, embodiments of the present invention provide various advantages. One such advantage includes utilizing a metal jog to increase the number of via ports on short metal lines. Another advantage includes the creation of metal 1 prohibit and allow zones, so that an EDA tool, such as a router, can create metal 1 jogs without risk of causing a metal 1 color conflict.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for designing an integrated circuit, comprising:
    arranging a plurality of cells, wherein each cell of the plurality of cells includes a plurality of metal lines which comprise inner metal lines and outer metal lines, and an intercell region disposed between each cell of the plurality of cells;
    identifying a metal layer prohibit zone for each of the plurality of cells;
    identifying a metal layer allow zone adjacent to the outer metal lines for each of the plurality of cells;
    identifying metal layer lines that are candidates to have a jog applied to them;
    applying a jog to the identified metal layer lines; and
    applying a via on the jog.

2. The method of claim 1, wherein identifying metal layer lines comprises identifying M1 lines.

3. The method of claim 2, wherein identifying metal layer lines comprises identifying metal layer lines that are shorter than a predetermined distance.

4. The method of claim 3, further comprising applying a viabar to at least one of the identified metal layer lines.

5. The method of claim 3, further comprising, applying at least three vias to at least one of the identified metal layer lines.

6. The method of claim 5, wherein applying at least three vias to at least one of the identified metal layer lines comprises applying at least one of the vias on the jog of the at least one of the identified metal layer lines.

7. The method of claim 1, wherein applying a jog to the identified metal layer lines comprises applying a jog that extends into the intercell region.

8. A system for designing an integrated circuit, comprising one or more processors coupled to non-transitory memory containing machine instructions, that when executed by the one or more processors, perform the functions of:
    arranging a plurality of cells including a plurality of metal lines which comprise inner metal lines and outer metal lines, and an intercell region disposed between each cell of the plurality of cells;
    establishing a metal layer prohibit zone for each of the plurality of cells;
    establishing a metal layer allow zone adjacent to the outer metal lines for each of the plurality of cells;
    identifying metal layer lines that are candidates to have a jog applied to them; and
    applying a jog to the identified metal layer lines.

9. The system of claim 8, wherein the non-transitory memory further comprises instructions that, when executed by the one or more processors, perform a function of: identifying metal layer lines that are adjacent to an intercell region.

10. The system of claim 9, wherein the non-transitory memory further comprises instructions that, when executed by the one or more processors, perform a function of applying a viabar to at least one of the identified metal layer lines.

11. The system of claim 9, wherein the non-transitory memory further comprises instructions that, when executed by the one or more processors, perform a function of applying at least three vias to at least one of the identified metal layer lines.

12. The system of claim 11, wherein the non-transitory memory further comprises instructions that, when executed by the one or more processors, perform a function of applying at least one of the vias on the jog of the at least one of the identified metal layer lines.

13. An integrated circuit comprising:
    a plurality of cells, wherein each cell of the plurality of cells includes a plurality of metal lines which comprise inner metal lines and outer metal lines, and an intercell region disposed between each cell of the plurality of cells; and
    a metal layer line within at least one cell of the plurality of cells, disposed adjacent to an intercell region, wherein the metal layer line comprises a jog.

14. The integrated circuit of claim 13, wherein the jog extends into an intercell region.

15. The integrated circuit of claim 14, further comprising a via disposed on the jog.

16. The integrated circuit of claim 15, wherein the metal layer line comprises an M1 line.

17. The integrated circuit of claim 14, wherein the metal layer line is L-shaped.

18. The integrated circuit of claim 14, wherein the metal layer line comprises a viabar disposed thereon.

19. The integrated circuit of claim 17, wherein the metal layer line comprises three via ports.

20. The integrated circuit of claim 14, wherein the plurality of cells comprises cells selected from the group consisting of NOT, NAND, NOR, XOR, AND, OR, and buffer.

* * * * *